(12) United States Patent
Van Der Wilt

(10) Patent No.: US 12,148,615 B2
(45) Date of Patent: Nov. 19, 2024

(54) METHOD AND APPARATUS FOR LASER ANNEALING

(71) Applicant: Coherent LaserSystems GmbH & Co. KG, Göttingen (DE)

(72) Inventor: Paul Van Der Wilt, Goettingen (DE)

(73) Assignee: Coherent LaserSystems GmbH & Co. KG, Göttingen (DE)

( * ) Notice: Subject to any disclaimer, the term of this patent is extended or adjusted under 35 U.S.C. 154(b) by 272 days.

(21) Appl. No.: 17/722,014

(22) Filed: Apr. 15, 2022

(65) Prior Publication Data

US 2022/0359197 A1    Nov. 10, 2022

Related U.S. Application Data

(60) Provisional application No. 63/185,273, filed on May 6, 2021, provisional application No. 63/251,174, filed on Oct. 1, 2021.

(51) Int. Cl.
*C30B 13/30* (2006.01)
*B23K 26/06* (2014.01)
(Continued)

(52) U.S. Cl.
CPC .... *H01L 21/02678* (2013.01); *B23K 26/0608* (2013.01); *B23K 26/0622* (2015.10); *B23K 26/53* (2015.10); *G02B 27/0955* (2013.01); *H01L 21/02686* (2013.01); *H01L 21/02691* (2013.01); *B23K 2103/56* (2018.08)

(58) Field of Classification Search
CPC ......... H01L 21/02678; H01L 21/02686; H01L 21/02691; B23K 26/0622; B23K 26/53; B23K 26/0608; B23K 2103/56; G02B 27/0955; C30B 13/30; C30B 13/22
See application file for complete search history.

(56) References Cited

U.S. PATENT DOCUMENTS

| 7,265,908 B2 | 9/2007 | Anikitchev et al. |
| 7,396,712 B2 | 7/2008 | Tanabe et al. |
| (Continued) | | |

FOREIGN PATENT DOCUMENTS

| JP | 2004266102 A | * | 9/2004 | ......... B23K 26/0604 |
| JP | 2017224708 A | | 12/2017 | |
| (Continued) | | | | |

OTHER PUBLICATIONS

International Search Report and Written Opinion received for International Patent Application No. PCT/EP2022/060723 mailed on Aug. 25, 2022, 11 pages.

(Continued)

*Primary Examiner* — Robert M Kunemund
(74) *Attorney, Agent, or Firm* — Morrison & Foerster LLP

(57) ABSTRACT

A layer on a substrate is laser annealed by pulses in a plurality of laser beams formed into a uniform line beam. The laser beams are partitioned into a first set of beams and a second set of beams. The second set of beams is incident onto the layer from a smaller range of angles than all of the beams combined. Pulses in the beams are synchronized such that pulses in the first set of beams are incident on the layer before pulses in the second set of beams. Pulses in the first set of beams melt the layer and pulses in the second set of beams sustain melting.

17 Claims, 7 Drawing Sheets

(51) Int. Cl.
*B23K 26/0622* (2014.01)
*B23K 26/53* (2014.01)
*G02B 27/09* (2006.01)
*H01L 21/02* (2006.01)
*B23K 103/00* (2006.01)

(56) References Cited

U.S. PATENT DOCUMENTS

| | | |
|---|---|---|
| 7,408,714 B2 | 8/2008 | Windpassinger et al. |
| 7,428,039 B2 | 9/2008 | Ferber |
| 7,615,722 B2 | 11/2009 | Govorkov et al. |
| 7,723,169 B2 | 5/2010 | Graefe et al. |
| 8,238,400 B2 | 8/2012 | Targsdorf et al. |
| 9,335,276 B2 | 5/2016 | Van der Wilt |
| 9,455,164 B2 | 9/2016 | Zhang et al. |
| 10,247,952 B2 | 4/2019 | Simon et al. |
| 2006/0249816 A1* | 11/2006 | Li .................. H01L 21/78 438/460 |
| 2013/0341310 A1 | 12/2013 | Van Der Wilt |
| 2014/0158193 A1* | 6/2014 | Desphande ......... H01L 31/1896 438/98 |
| 2020/0235544 A1 | 7/2020 | Hodgson et al. |

FOREIGN PATENT DOCUMENTS

| | | |
|---|---|---|
| WO | WO2003043070 A1 * | 3/2005 |
| WO | WO-2020225016 A1 | 11/2020 |

OTHER PUBLICATIONS

Kahlert et al., (2003). "High resolution optics for thin Si-film crystallization using excimer lasers: present status and future development," Proceedings of SPIE, 5004:20-27.

* cited by examiner

METHOD AND APPARATUS FOR LASER ANNEALING

PRIORITY

This application claims priority to U.S. Provisional Application Ser. No. 63/185,273, filed May 6, 2021 and U.S. Provisional Application Ser. No. 63/251,174 filed Oct. 1, 2021, the disclosures of which are incorporated herein by reference in their entirety.

TECHNICAL FIELD OF THE INVENTION

The present invention relates in general to annealing of amorphous silicon layers using ultraviolet laser radiation projected into a line beam. The invention relates in particular to annealing whereby the projected line beam is partitioned into temporally separated pulses that are delivered to the amorphous silicon layers at different angles of incidence.

DISCUSSION OF BACKGROUND ART

Laser silicon annealing is a critical processing step in the production of high-resolution active-matrix liquid crystal displays (AMLCDs) and active-matrix organic light emitting diode (AMOLED) displays. A thin amorphous silicon layer on a glass substrate is melted by a pulsed ultraviolet laser beam and crystallizes while cooling. The polycrystalline silicon layer becomes a semiconductor base, onto which thin-film transistors (TFTs) and other electronic circuits are formed by conventional lithographic processes. During the annealing step, the substrate and the silicon layer thereon are in the form of "panels", which may be later divided into the smaller individual displays, such as those used in consumer electronic devices.

Laser silicon annealing is a delicate process and it is essential to maintain an optimum energy density across the width of a panel during laser processing. The laser beam is shaped into an elongated "line beam" that is projected onto the panels. The line beam is characterized by a long axis, which spans the full width of a panel, and an orthogonal short axis. The line beam has a uniform or "flat-top" intensity distribution along the width of the panel. Each panel is scanned in the short-axis direction along the length of the panel. The scan speed is selected to repeatedly melt and anneal the silicon at each location on a panel until a desired polycrystalline micro-structure is obtained. Irradiation by about 20 consecutive laser pulses is typical. Exposing each location to multiple laser pulses also provides pulse-to-pulse averaging.

In an ideal micro-structure, crystal grains have a uniform size and orientation, with a minimal density of defects that could adversely affect the yield of usable panels. Interference effects during exposure to the line beam preferentially orient these crystal grains producing "ripples" in the surface of the annealed silicon. The quality of an annealed silicon layer can be assessed by illumination of the annealed silicon at an oblique angle to observe diffraction caused by the ripples. Non-uniformities in intensity along the long axis of the line beam produce stripes aligned along the short axis, known as "scan mura". Temporal fluctuations in intensity produce stripes aligned along the long axis, known as "shot mura". Methods for the characterization of silicon recrystallization are described in U.S. Pat. No. 9,335,276 and U.S Patent Publication 2013/0341310, each assigned to the assignee of the present invention and the complete disclosure of each is incorporated herein by reference. These methods can be applied during laser annealing to adjust the process in real time.

Excimer lasers have been favored for laser silicon annealing, which requires a stable laser beam having a low pulse-energy noise of less than about 1% RMS and an ultraviolet wavelength. For example, an argon-fluoride (ArF) excimer laser generating a 193 nanometer (nm) laser beam or a xenon fluoride (XeF) excimer laser generating a 351 nm laser beam. The most-powerful state-of-the-art industrial excimer lasers use xenon chloride (XeCl) to generate a 308 nm laser beam, having pulse energies of up to 1 joule at pulse repetition rates up to 600 hertz. For example, the Lambda SX excimer laser from Coherent Inc. of Santa Clara, California. These industrial excimer lasers can operate continuously for over 100 million pulses, while maintaining very-stable pulse energies and beam parameters. In applications requiring even greater pulse energies, the output of two or more excimer lasers can be combined by beam-mixing optics and by synchronization of the pulse delivery. Such beam-mixing and synchronization are described in U.S. Pat. Nos. 7,408,714 and 8,238,400, respectively, each assigned to the assignee of the present invention and the complete disclosure of each is incorporated herein by reference.

Methods and apparatus for shaping laser beams into uniform line beams are described in U.S. Pat. Nos. 7,265,908, 7,428,039, and 7,615,722, each thereof commonly owned and the complete disclosure of each is incorporated herein by reference. These methods incorporate beam homogenization, whereby the laser beam from one or more sources is spatially partitioned, with the partitioned beams overlaid and projected onto the silicon layer. For example, between ten and thirty partitioned beams overlaid and projected, each having dimensions of about 0.4 mm in a short axis and 750 mm to 1500 mm in a long axis. The beam-homogenization apparatus includes one or two "micro-lens arrays", comprising a plurality of individual "micro lenses" that are much smaller than the incident beam. Each micro lens becomes an illumination source contributing to the whole overlaid beam. Additional optics collect all the beams emerging from the micro lenses and shape them into the uniform line beam.

More recently, an ultraviolet diode-pumped solid-state laser was disclosed that is capable of laser silicon annealing to produce panels with the desired quality. This solid-state laser is described in U.S. patent publication 2020/0235544, which is commonly owned and the complete disclosure of which is incorporated herein by reference. Solid-state lasers have the advantages of a lower capital cost and a lower cost-of-operation than excimer lasers.

SUMMARY OF THE INVENTION

The gain medium in an excimer laser is a flowing and pressurized gas mixture, which typically includes a noble gas, a halide gas, and buffer gases. The gas mixture is energized by a short current pulse to generate excited weakly-bonded dimers in a gas discharge. For example, xenon-chloride dimers having a laser line at 308 nm. Laser pulses delivered by an excimer laser typically comprise two temporal peaks, having different amplitudes, with an overall pulse duration of tens of nanoseconds (ns). A pulse duration between 50 ns and 70 ns is typical for an excimer laser used in silicon laser annealing. The pulse duration affects the rate of ripple formation. If the overall pulse duration is too short, the scan speed would need to be reduced and the processing time would increase. The duration of pulses delivered to a panel may be extended by adding optical delays or by using multiple excimer laser resonators synchronized to deliver temporally separated pulses.

The gain medium in the aforementioned diode-pumped solid-state laser is a neodymium ($Nd^{3+}$) or ytterbium ($Yb^{3+}$) doped oxide crystal having optical gain at an infrared wavelength of around 1 micron (μm). Laser pulses are produced by Q-switch operation of a laser resonator and are frequency converted to ultraviolet wavelengths in optically nonlinear crystals. Laser pulses delivered by this solid-state laser have pulse durations of tens of nanoseconds. An exemplary laser having a $Nd^{3+}$:YAG gain crystal produced a laser beam at 355 nm by frequency tripling in two LBO crystals. The pulse duration was 25 ns when the laser resonator was optimized for highest output power.

There is need for laser annealing apparatus and methods that utilize solid-state lasers, with their capital cost and cost-of-operation advantages, to form polycrystalline silicon with the high quality of micro-structure currently provided by excimer lasers. Preferably, these laser annealing apparatus and methods would form micro-structure that is even closer to the ideal of uniform grain size and orientation, and with fewer defects.

In one aspect, a method is disclosed for annealing a layer on a substrate in accordance with the present invention. A plurality of pulsed laser beams is provided and divided into a first set of laser beams having a first set of laser pulses and a second set of laser beams having a second set of laser pulses. The laser beams are formed into a line beam. The line beam has a long dimension, an orthogonal short dimension, and a uniform intensity distribution along the long dimension. Each location along the long dimension of the line beam is illuminated by every one of the laser beams. The layer is illuminated with the line beam. The second set of laser beams is incident on the layer from a smaller range of angles than all of the laser beams combined. Pulses in the laser beams are synchronized such that the first set of laser pulses are incident on the layer before the second set of laser pulses. Pulses in the first set of laser beams melt material in the layer illuminated by the line beam and pulses in the second set of laser beams are incident on the layer before the melted material solidifies.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
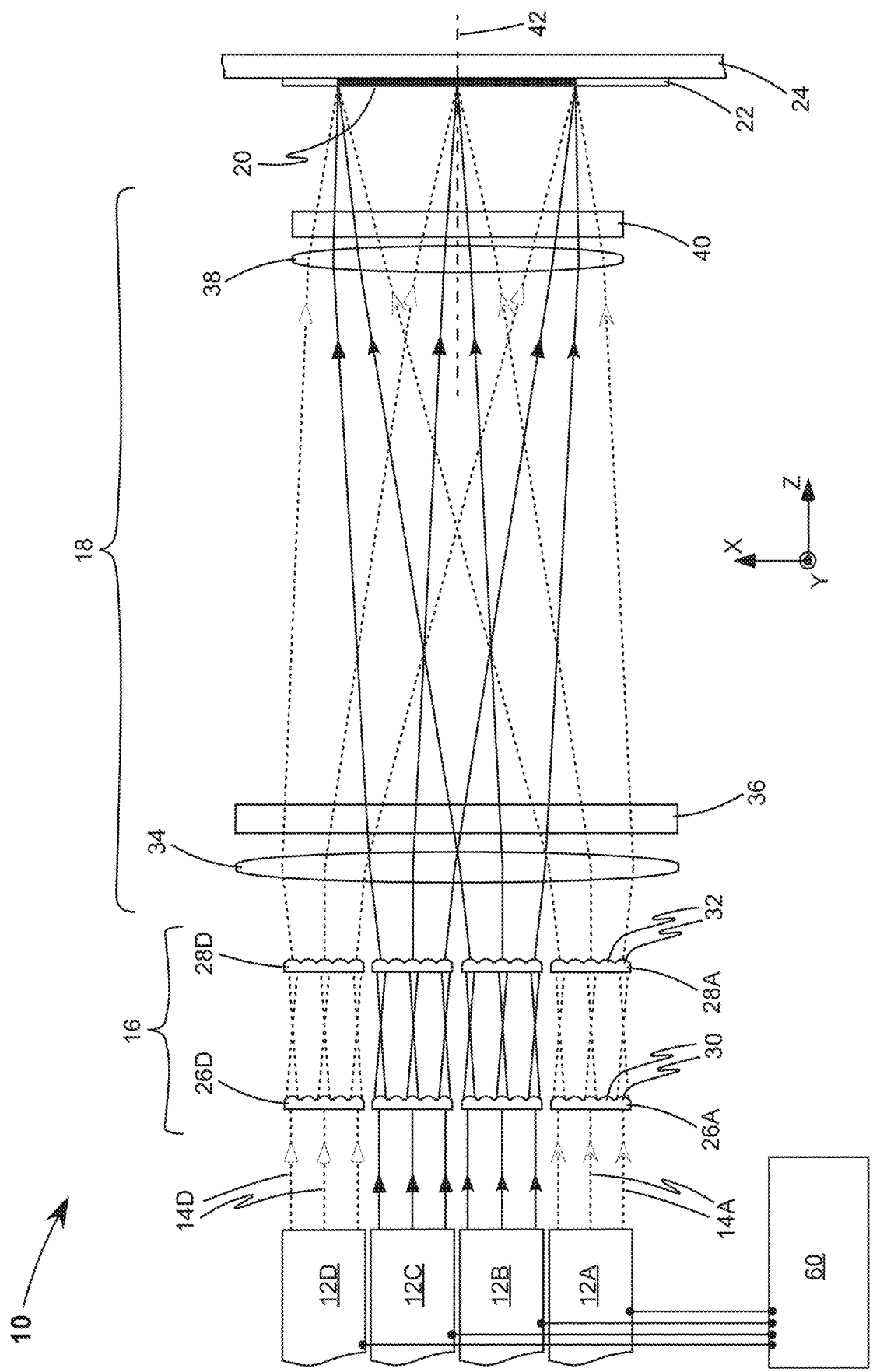
FIG. 1 schematically illustrates one preferred embodiment of optical apparatus in accordance with the present invention for illuminating and annealing a layer on a substrate, comprising a controller, a plurality of laser sources, a beam homogenizer including two sets of linear micro-lens arrays, and a beam projector including four cylindrical lenses.

Referring now to the drawings, wherein like components are designated by like numerals, FIG. 1 schematically illustrates a preferred embodiment of optical apparatus 10 in accordance with the present invention. Optical apparatus 10 includes a plurality of pulsed laser sources 12A-12D, each thereof providing a pulsed laser beam 14A-14D, which is directed into a beam homogenizer 16. Laser beams 14A-14D are transmitted through beam homogenizer 16 and are intercepted by a beam projector 18. Beam homogenizer 16 and beam projector 18 cooperatively form laser beams 14A-14D into a line beam 20 that illuminates a layer 22 on a substrate 24. Layer 22 is made of a material-to-be-annealed; for example, amorphous silicon. Substrate 24 is made of a supporting material, such as a glass.

Cartesian axes on the drawings are for reference. Laser beams 14A-14D propagate along a "Z" axis between laser sources 12A-12D and layer 22. Laser beams 14A-14D have orthogonal transverse "X" and "Y" axes that correspond to a long dimension and a short dimension of line beam 20, respectively. Laser beams 14A-14D are depicted with different arrow heads to identify and distinguish them in the drawings. Each beam is depicted in FIG. 1 as a center ray and two peripheral rays.

Here, beam homogenizer 16 comprises two sets of linear micro-lens arrays, 26A-26D and 28A-28D. Each micro-lens array includes a plurality of cylindrical micro lenses 30 or 32 linearly arranged along the X axis. The individual micro-lens arrays in each set are also linearly arranged along the X axis. Beam homogenizer 16 thus has a long axis parallel to the X axis and an orthogonal short axis parallel to the Y axis. In an alternative arrangement, multiple individual micro-lens arrays in each set of micro-lens arrays may be replaced by a single micro-lens array, which intercepts all of the laser beams. Laser beams 14A-14D propagate from laser sources 12A-12D, through micro-lens arrays 26A-26D, and then through micro-lens arrays 28A-28D.

Laser beams 14A-14D directed onto beam homogenizer 16 are arranged serially along the long axis thereof. Here, laser beams 14A-14D illuminate linear micro-lens arrays 26A-26D and then micro-lens arrays 28A-28D, respectively. Laser beams 14A-14D emerging from micro-lens arrays 28A-28D are divergent in the long axis (X axis). When laser beams 14A-14D directed onto beam homogenizer 16 are well collimated, micro-lens arrays 26A-26D may be omitted, since the practical purpose thereof is to increase the angular acceptance of beam homogenizer 16.

Here, beam projector 18 comprises four cylindrical lenses 34, 36, 38, and 40, which are serially arranged in numerical order between beam homogenizer 16 and layer 22. Cylindrical lenses 34 and 38 have positive optical power in the long dimension (X axis). Cylindrical lens 38 has an optical axis 42 that is about perpendicular to substrate 24, at least in the long dimension. Cylindrical lens 34 is arranged to intercept diverging laser radiation from all cylindrical micro lenses 32 and together with cylindrical lens 38 forms line beam 20 in the long dimension. Although cylindrical lens 34 alone would be sufficient for forming the line beam in the long dimension, by converging and overlapping laser radiation from all the micro lenses, beam projectors typically have multiple optical elements. Here, one practical advantage of including cylindrical lens 38 in beam projector 18 is that the overall length of optical apparatus 10 is reduced.

Each cylindrical micro lens 32 in micro-lens arrays 28A-28D is a source of divergent laser radiation. The laser radiation emerging from each cylindrical micro lens 32 overlaps the laser radiation from every one of the other cylindrical micro lenses 32 in line beam 20. Each location along the long dimension of line beam 20 is thereby illuminated by every one of laser beams 14A-14D and is homogenized. Line beam 20 is located on layer 22 and has a uniform intensity distribution along the long dimension (X axis). Line beam 20 thereby uniformly illuminates layer 22 during annealing.

Cylindrical lenses 36 and 40 have optical power in the short dimension (Y axis). Cylindrical lens 36 is arranged to intercept all of the laser radiation and together with cylindrical lens 40 forms line beam 20 in the short dimension. Overall, all rays in the laser radiation are focused in the long dimension (X axis) by cylindrical lenses 34 and 38, and in the short dimension by cylindrical lenses 36 and 40. All the rays converge towards line beam 20.

Figure 2:
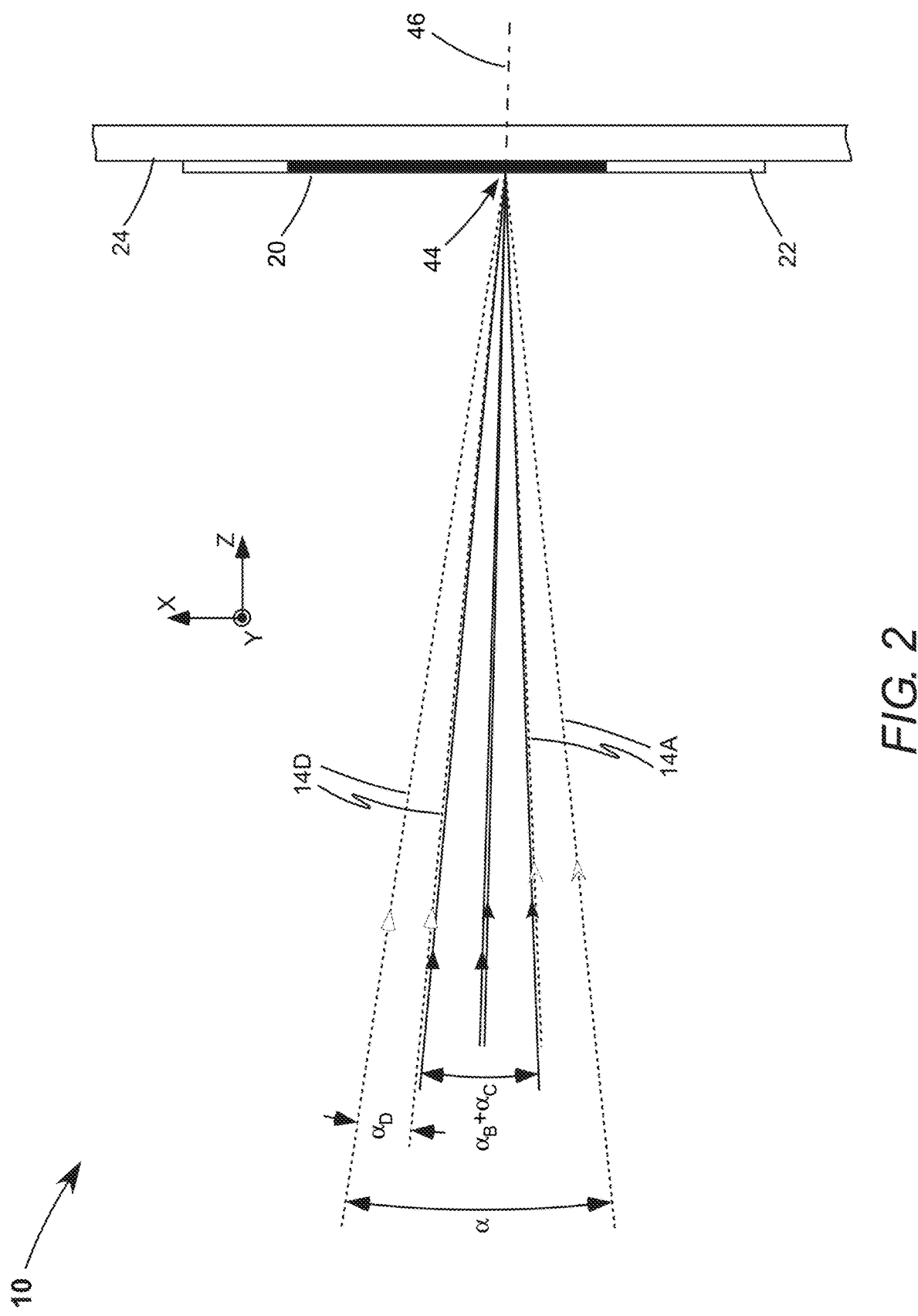
FIG. 2 is a magnified view of the optical apparatus of FIG. 1, illustrating a plurality of pulsed laser beams provided by the laser sources focused onto one location in a long dimension of a line beam for annealing the layer, with the line beam formed cooperatively by the beam homogenizer and the beam projector.

FIG. 2 schematically illustrates further details of laser beams 14A-14D formed into line beam 20 and is magnified compared to FIG. 1. The drawing depicts portions of laser beams 14A-14D focused in the long dimension (X axis) onto one location 44 in line beam 20. In FIG. 1, each of laser beams 14A-14D is depicted as a single ray incident on each location in line beam 20. In FIG. 2, each of laser beams 14A-14D is depicted as two boundary rays and extends across a range of incidence angles. Laser beam 14D, for example, spans an angle $\alpha_D$. Collectively, laser beams 14A-14D span a larger angle $\alpha$. A center axis 46 is the centroid of the portions of laser beams 14A-14D focused onto location 44.

In the exemplary apparatus depicted in FIGS. 1 and 2, wherein laser beams 14A-14D pass through separate identical pairs of linear micro-lens arrays, the laser beams are incident on location 44 over non-overlapping ranges of angles. Each laser beam spans approximately the same angle while illuminating location 44. In the exemplary apparatus there are four laser sources, so each laser beam incident on location 44 spans an angle that is approximately equal to or slightly less than $0.25\alpha$. For example, $\alpha$ is about 8° and $\alpha_D$ is about 2°.

I have found that illumination of layer 22 from a smaller range of angles is favorable for ripple formation and high-quality laser annealing. For example, if all of laser sources 12A-12D are utilized, a smaller angle $\alpha$ is favorable. Alternatively, if just laser source 12D is utilized, a smaller angle $\alpha_D$ is favorable. To minimize these angles, the focal lengths of cylindrical lenses 32, 34, and 38 would be made as long as practically possible. The focal length of cylindrical micro lenses 30 and widths of cylindrical micro lenses 30 and 32 may need to be adjusted accordingly.

Figure 3:
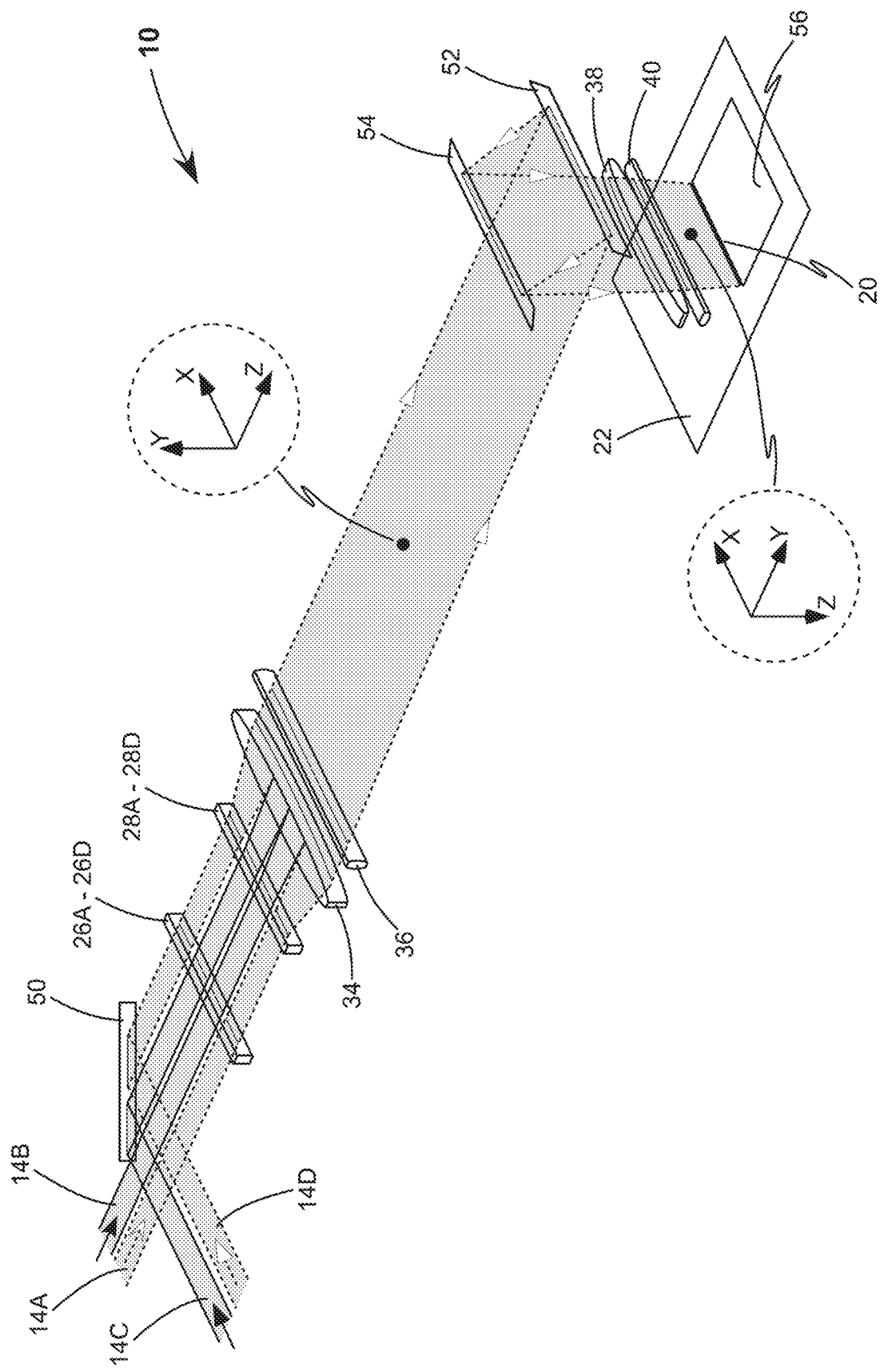
FIG. 3 is a perspective view of a practical arrangement of the optical apparatus of FIG. 1.

FIG. 3 is a perspective view of a practical arrangement of optical apparatus 10, with laser sources 12A-12D omitted for clarity of illustration. In the arrangement, optical apparatus 10 includes an additional steering mirror 50, which directs laser beams 14C and 14D into linear micro-lens arrays 26C and 26D. Steering optics, such as steering mirror 50, enable a compact arrangement of optical elements inside an integrated tool for laser annealing. A mirror 52 and another mirror 54 together direct the laser radiation onto substrate 24 and layer 22 thereon, which are preferably horizontal during annealing. One or both of mirrors 52 and 54 may be rapidly and repetitively tilted through a small range of angles to "micro-smooth" line beam 20 in the long dimension thereof, as described in U.S. Pat. No. 7,723,169, which is commonly owned and the complete disclosure of which is incorporated herein by reference.

Cartesian axes on the drawing indicate the propagation axis Z and the transverse axes X and Y as the laser radiation is directed through beam homogenizer 16 and beam projector 18 onto layer 22. During annealing, substrate 24 and layer 22 thereon are translated in the short dimension (Y axis), transforming a portion 56 of layer 22 illuminated by line beam 20. In a working example of optical apparatus 10, layer 22 is made of amorphous silicon that is transformed by laser annealing into polycrystalline silicon in portion 56.

Returning to FIG. 1, optical apparatus 10 further includes a controller 60 that is connected to each of laser sources 12A-12D. Controller 60 sends a clock signal or trigger signal that governs when each of laser sources 12A-12D produces a pulse of laser radiation. Controller 60 thereby synchronizes pulses in laser beams 14A-14D with respect to each other.

Figure 4:
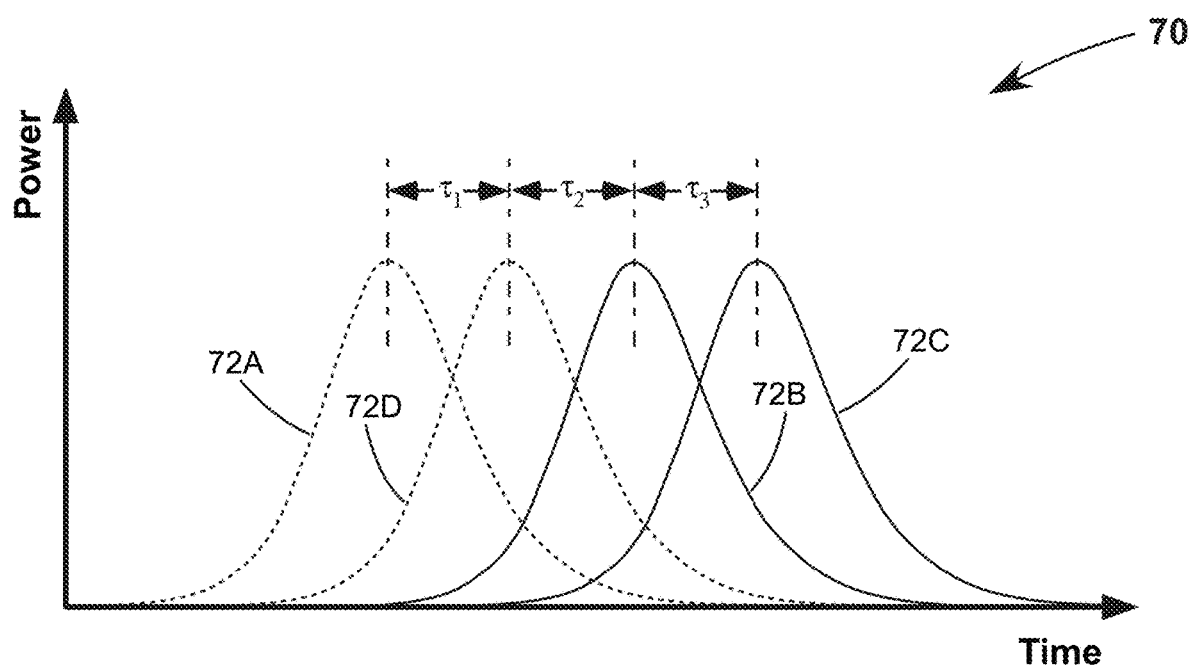
FIG. 4 is a graph of optical power vs. time, schematically illustrating one preferred embodiment for synchronization of pulses in the laser beams of FIG. 2 incident on the location in the line beam.

FIG. 4 is a graph of optical power vs. time schematically illustrating pulses in laser beams 14A-14D incident on location 44 in line beam 20 and illuminating layer 22. Pulses 72A-72D are provided by laser sources 12A-12D. FIG. 4 depicts one embodiment of pulse synchronization 70 by controller 60, in which sequential pulses partially overlap and the temporal separation between sequential pulses is about equal. In the example of pulse synchronization depicted, pulses 72A, 72D, 72B, and 72C are incident on location 44 in that order. Pulses 72A and 72D are separated by a time $\tau_1$, pulses 72D and 72B are separated by a time $\tau_2$, pulses 72B and 72C are separated by a time $\tau_3$, and $\tau_1 \approx \tau_2 \approx \tau_3$. The four individual pulses 72A-72D collectively form a longer pulse and extend the time layer 22 is continuously illuminated. For example, a pulse having an effective duration of up to about 100 ns could be formed from four individual pulses generated by Q-switched lasers, each having a duration of 25 ns.

Figure 5A:
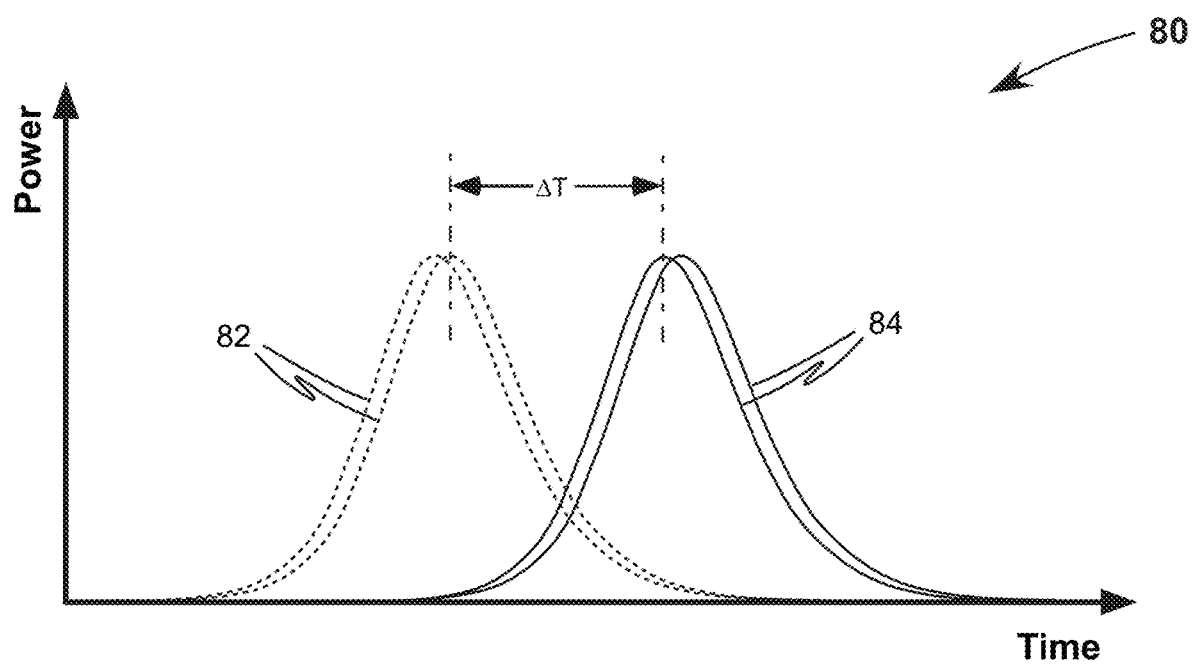
FIGS. 5A, 5B, and 5C are graphs of optical power vs. time, schematically illustrating three preferred embodiments for synchronization of pulses in the laser beams of FIG. 2 incident on the location in the line beam.

FIG. 5A is a graph of optical power vs. time illustrating another embodiment of pulse synchronization 80 by controller 60. A first set of pulses 82 provided by two of the laser sources is incident on layer 22 prior to a second set of pulses 84 provided by the other two laser sources. Pulses in first set 82 are incident simultaneously or nearly simultaneously (as depicted). Pulses in first set 82 melt material in layer 22 illuminated by line beam 20. After a delay time $\Delta T$, pulses in second set 84 are incident on layer 22 simultaneously or nearly simultaneously, before the melted material solidifies. Near simultaneous illumination by pulses within each set maximizes the total optical power to initialize and sustain melting. Delay time $\Delta T$ prolongs the time the material is in a molten liquid phase, which is favorable for crystallization of the material and high-quality micro-structure formation. Pulse synchronization 80 effectively simulates a longer pulse than could be provided by any of laser sources 12A-12D individually.

In one example of pulse synchronization 80, first set of pulses 82 comprises pulses 72A and 72D, and second set of pulses 84 comprises pulses 72B and 72C. In this example, referring to FIG. 4, $\tau_1 \approx 0$, $\tau_2 \approx \Delta T$, and $\tau_3 \approx 0$. Referring to FIG. 2, a first set of laser beams 14A and 14D is incident on location 44. Then, after delay time $\Delta T$, a second set of laser beams 14B and 14C is incident on location 44. The second set of laser beams span an angle about $\alpha_B + \alpha_C$ that is smaller than angle $\alpha$. As discussed above, a smaller angular distribution produces higher-quality micro-structure in laser annealed polycrystalline silicon. Further, I have found that it is most-favorable to illuminate the molten silicon with a smaller angular distribution at the time the micro-structure is precipitating from the melted material. Generally, precipitation will happen towards the end of each repeated cycle of melting and annealing. Applying this insight to pulse synchronization 80, the pulses could be demarcated such that the second set of pulses could be any of 72A and 72B, 72B and 72C, or 72C and 72D.

Figure 5B:
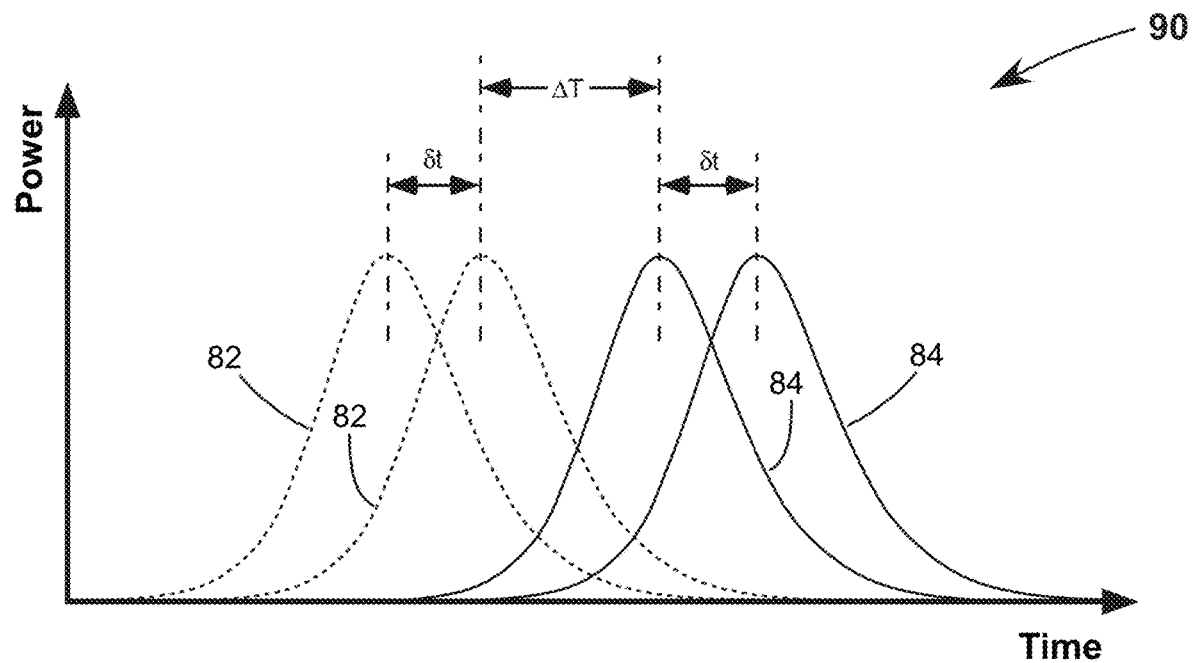

FIG. 5B is a graph of optical power vs. time illustrating yet another embodiment of pulse synchronization 90 by controller 60. The individual pulses within each of first set 82 and second set 84 are temporally separated. In the example depicted, pulses within first set 82 are mutually separated by time $\delta t$, pulses within second set 84 are mutually separated by about the same time $\delta t$, and time $\delta t$ is about half of delay time $\Delta T$. Overall, first set 82 melts material in layer 22 illuminated by line beam 20 and second set 84 prolongs the time the material is in a molten liquid phase. More generally, $\Delta T \geq 2 \times \delta t$, which means pulse synchronization 90 sustains melting for a longer overall time than pulse synchronization 70 or 80.

Figure 5C:
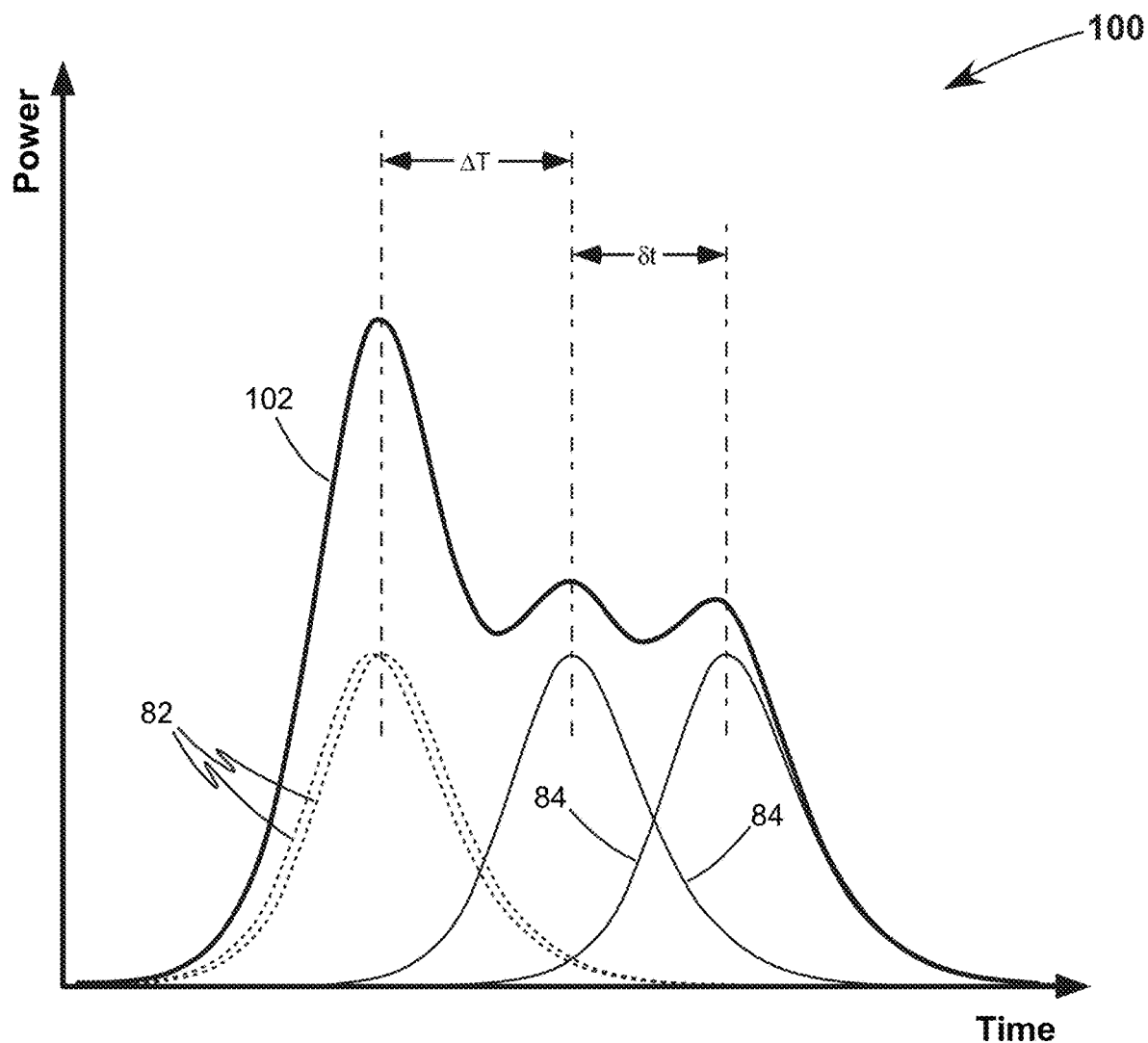

FIG. 5C is a graph of optical power vs. time illustrating still another embodiment of pulse synchronization 100 by controller 60. Integrated optical power 102 provided by all of the individual pulses is depicted by a heavier line. Pulses within first set 82 are incident simultaneously or nearly simultaneously. Pulses within second set 84 are temporally separated by time $\delta t$. In the example depicted, delay time $\Delta T$ is equal to about $1.3 \times \delta t$. Overall, first set of pulses 82 provides sufficient energy to melt material in layer 22 illuminated by line beam 20 and second set of pulses 84 provides sufficient optical power to prolong the time the material is in a molten liquid phase. Integrated optical power 102 of pulse synchronization 100 is closer to replicating the two temporal amplitude peaks that are typical of excimer lasers used for laser annealing. However, pulse synchronization 100 using optical apparatus 10 may be superior, because integrated optical power 102 is more-constant while sustaining melting.

Again, in pulse synchronization 90 or 100, the second set of pulses could be any of 72A and 72B, 72B and 72C, or 72C and 72D. Generally, the last pulse would have the greatest impact on the quality of the micro-structure that is produced by the laser annealing. In pulse synchronization 90 or 100, that last pulse could be either pulse in second set 84, since each of laser beams 14A-14D incident on location 44 spans approximately the same angle ($\alpha_A \approx \alpha_B \approx \alpha_C \approx \alpha_D$).

Figure 6A:
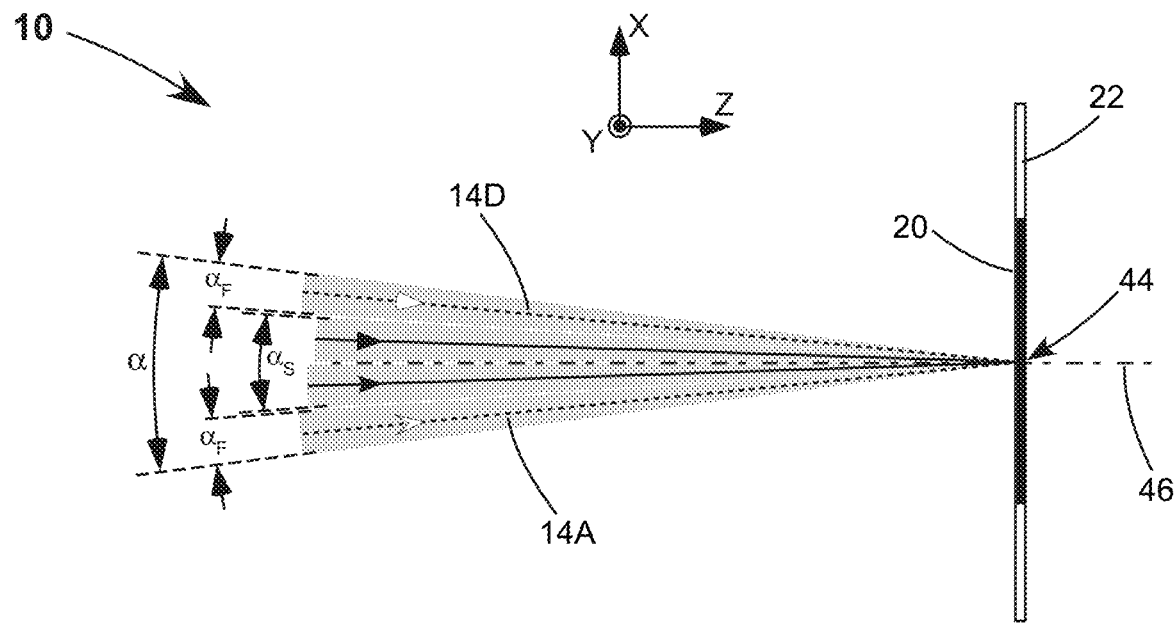
FIG. 6A is a magnified view of optical apparatus FIG. 1 that is similar to FIG. 2, schematically illustrating pulsed laser beams focused onto one location in the long dimension of the line beam.

Returning to FIG. 2, laser beams 14B and 14C are closer to center axis 46 and together span an angle of about $\alpha_B + \alpha_C$, which is smaller than angle $\alpha$. Laser beams 14A and 14D are further from center axis 46 and span angle $\alpha$. FIG. 6A schematically illustrates laser beams 14A-14D formed into line beam 20 and is similar to FIG. 2. A first set of laser beams 14A and 14D are incident on location 44 within a first range of angles $\alpha_F$ with respect to center axis 46. A second set of laser beams 14B and 14C are incident on location 44 within a second range of angles $\alpha_S$ with respect to center axis 46. Second range of angles $\alpha_S$ is closer to center axis 46 than first range of angles $\alpha_F$. For example, angles $\alpha_F$ are in a range between about 2° and about 4° and angles $\alpha_S$ are in a range between 0° and about 2°.

Applying pulse synchronization 80, 90, or 100 to this arrangement, high-quality microstructure is produced when first set of pulses 82 is in the first set of laser beams and second set of pulses 84 is in the second set of laser beams. That is, pulses 72B and 72C in laser beams 14B and 14C are selected to be second set of pulses 84.

In the exemplary arrangement depicted in FIG. 6A, center axis 46 of line beam 20 is about perpendicular to layer 22 at location 44. If beam projector 18 is telecentric, center axis 46 would be about perpendicular to layer 22 at every location in line beam 20, and center axis 46 would be about parallel to optical axis 42 of cylindrical lens 38. In the arrangement depicted, laser beams 14B and 14C have smaller angles of incidence on layer 22 than laser beams 14A and 14D. In some annealing applications, higher-quality microstructure is produced by selecting a second set of pulses in laser beams that have both a smaller angular distribution and smaller angles of incidence. Here, laser beams 14B and 14C are incident on location 44 within a second range of angles $\alpha_S$, which is smaller than angle $\alpha$. Laser beams 14B and 14C also have smaller angles of incidence, up to about $\alpha_B \approx \alpha_C$. Laser beams 14A and 14D have larger angles of incidence, up to about $\alpha_A + \alpha_B \approx \alpha_C + \alpha_D$.

Figure 6B:
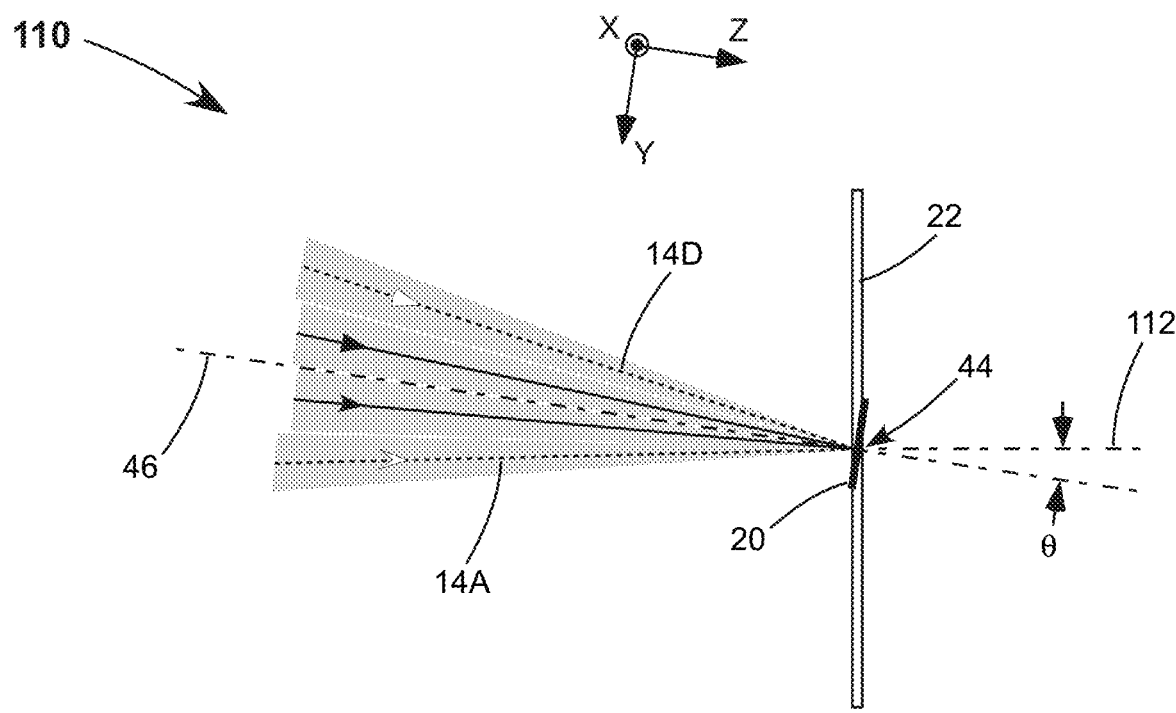
FIG. 6B is a magnified view of another preferred embodiment of optical apparatus in accordance with the present invention, similar to the embodiment of FIGS. 1 and 2, schematically illustrating a plurality of pulsed laser beams focused onto one location in a short dimension of a line beam.

FIG. 6B schematically illustrates details of another preferred embodiment of optical apparatus 110 in accordance with the present invention. Optical apparatus 110 is similar to optical apparatus 10 of FIG. 1, including beam homogenizer 16 and a beam projector 18 for cooperatively forming a line beam 20. Optical apparatus 110 focuses laser beams 14A-14D in the short dimension (Y-axis) on location 44. In the short dimension, center axis 46 may be tilted at a small angle $\theta$ with respect to a normal 112 of layer 22, as depicted here. In practice, this is achieved by tilting the optical axis of cylindrical lenses 38 and 40. Tilting helps to mitigate back reflections from layer 22. Angle $\theta$ is typically in a range between 4° and 12°. By way of example, an angle of 8° is depicted in the drawing. It should be noted that line beam 20 is depicted in FIGS. 6A and 6B as a wavefront of the laser radiation.

A combined optical apparatus would have elements of optical apparatus 10 and 110. Optical apparatus 110 may include an additional beam homogenizer (not shown) located between laser sources 12A-12D and beam projector 18. The additional beam homogenizer would have cylindrical micro lenses linearly arranged along the short dimension (Y-axis) and these micro lenses would have positive optical power in the short dimension. Laser beams 14A-14D would be directed onto the additional beam homogenizer at different angles in the short dimension. Laser beams 14A and 14D would be directed closer to the periphery of the additional beam homogenizer and the laser beams 14B and 14C would be directed closer to the center of the additional beam homogenizer.

Alternatively, optical apparatus 110 may omit the additional beam homogenizer by simply directing laser beams 14A-14D through beam homogenizer 16 and beam projector 18, while properly accounting for the imaging properties of cylindrical lenses 36 and 40 in the short dimension. In an imaging plane of layer 22, laser beams 14A and 14D would be directed at larger angles relative to laser beams 14B and 14C. In a Fourier plane of layer 22, laser beams 14A and 14D would have larger displacements relative to laser beams 14B and 14C.

In these arrangements, laser beams 14A and 14D focused on layer 22 are further from center axis 46 and laser beams 14B and 14C are closer to center axis 46, in both the long and short dimensions. This focusing arrangement, when combined with the inventive synchronization of the pulses in laser beams 14A-14D by controller 60, also provides a higher-quality micro-structure in layer 22 after annealing.

The inventive optical apparatus divides the pulses into first set 82 in a first set of laser beams, followed by second set 84 in a second set of laser beams, the second set of laser beams being incident from a smaller range of angles than all of the laser beams that form the line beam combined. The line beam forms an annealed micro-structure having about the same quality as would be formed by a line beam when all of the laser beams are incident from the smaller range of angles. However, the inventive optical apparatus is more compact along the beam propagation axis (Z axis) than an equivalent optical apparatus that delivers all of the laser beams within the smaller second range of angles. In the long dimension (X axis), the propagation length from cylindrical lens 34 to layer 22 determines the angular distribution for laser radiation converging onto one location of layer 22. By way of example, to form a 2300 millimeter (mm) long line beam with an angular distribution of 1.7° in one example of the optical apparatus requires a propagation length of about 50 m. In comparison, to form the same line beam in an equivalent apparatus having a smaller maximum angular distribution of 0.85° requires a longer propagation length of about 90 m. The inventive optical apparatus that delivers just the second set of pulses in a smaller range of angles can provide the desired laser annealing quality in a much more compact tool.

The optimum parameters for laser annealing vary, depending on such factors as the thickness of layer 22, the thickness of substrate 24, the heat capacity and thermal conductivity of substrate 24, the wavelength of the laser radiation, and the durations of the individual pulses. In the case of a silicon layer, a glass substrate, and laser radiation having a wavelength of about 355 nm and a pulse duration of 20-30 ns: the energy deposited on layer 22 by each individual pulse may be in a range 0.1-0.5 milli-joules per square centimeter (mJ/cm$^2$), delay time $\Delta T$ may be in a range 20-120 ns, time $\delta t$ may be in a range 0-60 ns, individual laser beams may span an angle ($\alpha_A$, $\alpha_B$, $\alpha_C$, or $\alpha_D$) up to 3° and all the laser beams may span an angle $\alpha$ up to 18°. Equivalently, first range of angles $\alpha_F$ may be in a range 1°-9° and second range of angles $\alpha_S$ may be in a range 0°-3°.

The periodic micro-structure in annealed polycrystalline silicon is formed by interference within the focused laser radiation and this periodicity is formed primarily in the direction of the electric field. It was found that an unpolarized line beam can produce a micro-structure aligned along both the long and short dimensions of the line beam. Either of optical apparatus 10 or optical apparatus 110 can produce annealed silicon layers of sufficient quality to make commercial displays using laser beams that are unpolarized. Alternatively, polarized laser beams or partially polarized beams may be selectively directed within optical apparatus 10 or optical apparatus 110 to achieve an optimal mixture of polarizations incident on the silicon layer.

Although the inventive optical apparatus is depicted herein having four laser sources, it may have any number of laser sources that can be partitioned into at least a first set of pulses and a second set of pulses. The laser sources may be of any type suitable for melting the material-to-be-annealed. In the case of amorphous silicon, excimer lasers and the diode-pumped solid-state lasers described in the aforementioned U.S. patent publication 2020/0235544 have proven suitable for laser annealing.

All the pulses in the first set of pulses, together, have sufficient energy to melt the material in the layer. Application of the first pulse or initial pulses in the first set may preheat the material, with melting occurring following application of later pulses or even the last pulse in the first set. Alternatively, the first set of pulses may be just one pulse that has sufficient energy to melt the material in the layer.

The second set of pulses may be just one pulse, which is incident on the layer within the second range of angles and with a delay time sufficient to prolong the time the material is molten. For example, referring to FIG. 4, first set 82 may be pulses 72A, 72D, and 72B, while second set 84 is pulse 72C. The last pulse (here, pulse 72C in laser beam 14C) would have the greatest impact on the quality of microstructure that is produced by the laser annealing, assuming that the micro-structure precipitates from the melted material during this last pulse. Optical interference of laser radiation in the last pulse would produce the micro-structure; for example, crystal grain structure in laser annealed silicon.

The laser beams collectively span a range of incidence angles $\alpha$. Pulses in at least one of the laser beams illuminate the layer later than pulses in all of the other laser beams, but before the material melted by the first set of pulses solidifies. The at-least-one laser beam spans a range of incidence angles that is preferably less than $0.5\alpha$ and is most-preferably less than $0.25\alpha$.

In summary, a plurality of laser beams is divided into a first set of laser beams having a first set of laser pulses and a second set of laser beams having a second set of pulses. A beam homogenizer and a beam projector cooperatively form the laser beams into a line beam having a long dimension and a short dimension. The line beam has a uniform intensity distribution along the long dimension for annealing a layer on a substrate. The second set of laser beams is incident on the layer from a smaller range of angles than all of the laser beams combined. A controller synchronizes the pulses such that the first set of laser pulses is incident on the layer before the second set of pulses.

The present invention is described above in terms of a preferred embodiment and other embodiments. The invention is not limited, however, to the embodiments described and depicted herein. Rather, the invention is limited only by the claims appended hereto.

What is claimed is:

1. A method for annealing a layer on a substrate, comprising the steps of:

providing a plurality of pulsed laser beams, the laser beams divided into a first set of laser beams having a first set of laser pulses and a second set of laser beams having a second set of laser pulses;

forming the laser beams into a line beam, the line beam having a long dimension and an orthogonal short dimension, the line beam having a uniform intensity distribution along the long dimension, each location along the long dimension of the line beam illuminated by every one of the laser beams;

illuminating the layer with the line beam, the second set of laser beams incident on the layer from a smaller range of angles than all of the laser beams combined; and synchronizing pulses in the laser beams such that the first set of laser pulses are incident on the layer before the second set of laser pulses, the pulses in the first set of laser beams melting material in the layer illuminated by the line beam and the pulses in the second set of laser beams incident on the layer before the melted material solidifies.

2. The method for annealing of claim 1, wherein the layer is made of amorphous silicon that is transformed by the annealing into polycrystalline silicon.

3. The method for annealing of claim 1, wherein sequential pulses within the first and second sets of laser beams partially overlap and temporal separations between sequential pulses are equal, thereby extending a time the layer is continuously illuminated by the line beam.

4. The method for annealing of claim 1, wherein the first set of laser pulses are incident on the layer simultaneously, the first set of pulses and the second set of pulses are separated by a delay time $\Delta T$, and the second set of laser pulses are incident on the layer simultaneously.

5. The method for annealing of claim 1, wherein the first set of pulses are mutually separated by a time $\delta t$, the first set of pulses and the second set of pulses are separated by a delay time $\Delta T$, and the second set of pulses are mutually separated by the time $\delta t$.

6. The method for annealing of claim 5, wherein $\Delta T \geq 2\ \delta t$.

7. The method for annealing of claim 5, wherein the delay time $\Delta T$ is in a range between 20 and 120 nanoseconds and the time $\delta t$ is in a range between 0 and 60 nanoseconds.

8. The method for annealing of claim 1, wherein the first set of pulses are incident on the layer simultaneously, the first set of pulses and the second set of pulses are separated by a delay time $\Delta T$, and the second set of pulses are mutually separated by a time $\delta t$.

9. The method for annealing of claim 8, wherein $\Delta T=1.3\ \delta t$.

10. The method for annealing of claim 8, wherein the delay time $\Delta T$ is in a range between 20 and 120 nanoseconds and the time $\delta t$ is in a range between 0 and 60 nanoseconds.

11. The method for annealing of claim 1, wherein the first set of laser beams are incident on the layer within a first range of angles $\alpha_F$ with respect to a center axis of the line beam, the second set of laser beams are incident on the layer within a second range of angles $\alpha_S$ with respect to the center axis, and the second range of angles $\alpha_S$ is closer to the center axis than the first range of angles $\alpha_F$.

12. The method for annealing of claim 11, wherein the first range of angles $\alpha_F$ is in a range between 1° and 9° and the second range of angles $\alpha_S$ is in a range between 0° and 3°.

13. The method for annealing of claim 11, wherein the center axis is perpendicular to the layer in the long dimension.

14. The method for annealing of claim 11, wherein the second set of laser beams have smaller angles of incidence on the layer than the first set of laser beams.

15. The method for annealing of claim 11, wherein the center axis is tilted with respect to a normal of the layer in the short dimension by an angle $\theta$ in a range between 4° and 12°.

16. The method for annealing of claim 1, wherein the second set of laser beams is unpolarized.

17. The method for annealing of claim 1, wherein the first and second sets of laser beams have a wavelength of 355 nanometers and the first and second sets of laser pulses have a pulse duration in a range between 20 and 30 nanoseconds.

\* \* \* \* \*